United States Patent
Narathong et al.

(10) Patent No.: US 7,564,276 B2
(45) Date of Patent: Jul. 21, 2009

(54) LOW-POWER MODULUS DIVIDER STAGE

(75) Inventors: Chiewcharn Narathong, Laguna Niguel, CA (US); Wenjun Su, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 125 days.

(21) Appl. No.: 11/560,973

(22) Filed: Nov. 17, 2006

(65) Prior Publication Data

US 2008/0042699 A1 Feb. 21, 2008

Related U.S. Application Data

(60) Provisional application No. 60/817,572, filed on Jun. 28, 2006.

(51) Int. Cl.
*H03B 19/00* (2006.01)

(52) U.S. Cl. .................. 327/117; 327/115; 377/47; 377/48

(58) Field of Classification Search .............. 327/115, 327/117; 377/47, 48
See application file for complete search history.

(56) References Cited

U.S. PATENT DOCUMENTS 7,298,810 B2 * 11/2007 Ke .................. 377/48

FOREIGN PATENT DOCUMENTS

| JP | 11003131 | 1/1999 |
|---|---|---|
| JP | 04318390 | 11/2004 |
| SU | 771880 | 10/1980 |

OTHER PUBLICATIONS

International Search Report—PCT/US07/072215, International Search Authority—European Patent Office—Nov. 28, 2007.
Written Opinion—PCT/US07/072215, International Search Authority—European Patent Office—Nov. 28, 2007.

* cited by examiner

*Primary Examiner*—Lincoln Donovan
*Assistant Examiner*—Brandon S Cole
(74) *Attorney, Agent, or Firm*—Jiayu Xu

(57) ABSTRACT

A modulus divider stage (MDS) includes first and second stages. The MDS receives a modulus divisor control signal S that determines whether the MDS stage operates in a divide-by-two mode or a divide-by-three mode. The MDS stage also receives a feedback modulus control signal from another MDS. When in the divide-by-two mode, the MDS divides by two regardless of the feedback modulus control signal. To conserve power, the first stage is unpowered when the MDS stage operates in the divide-by-two mode. When in the divide-by-three mode, the MDS stage either divides by two or by three depending on the feedback modulus control signal. To further reduce power consumption, the first stage is unpowered when the MDS stage is in the divide-by-three mode but is nonetheless performing a divide-by-two operation. A power-down transistor holds the output of the first stage at the proper logic level when the first stage is unpowered.

27 Claims, 13 Drawing Sheets

$$X = 128 + (S6 * 2^6) + (S5 * 2^5) + (S4 * 2^4) + (S3 * 2^3) + (S2 * 2^2) + (S1 * 2^1) + (S0 * 2^0)$$

$$181 = 128 + 53$$

$$181 = 128 + (S6 * 2^6) + (S5 * 2^5) + (S4 * 2^4) + (S3 * 2^3) + (S2 * 2^2) + (S1 * 2^1) + (S0 * 2^0)$$

MULTI-MODULUS DIVIDER IS TO DIVIDE BY 181

MODULUS DIVISOR CONTROL SIGNALS SUPPLIED TO MULTI-MODULUS DIVIDER

EQUATION FOR SEVEN-STAGE MODULUS DIVIDER

BUFFER

OUTPUT
SYNCHRONIZER

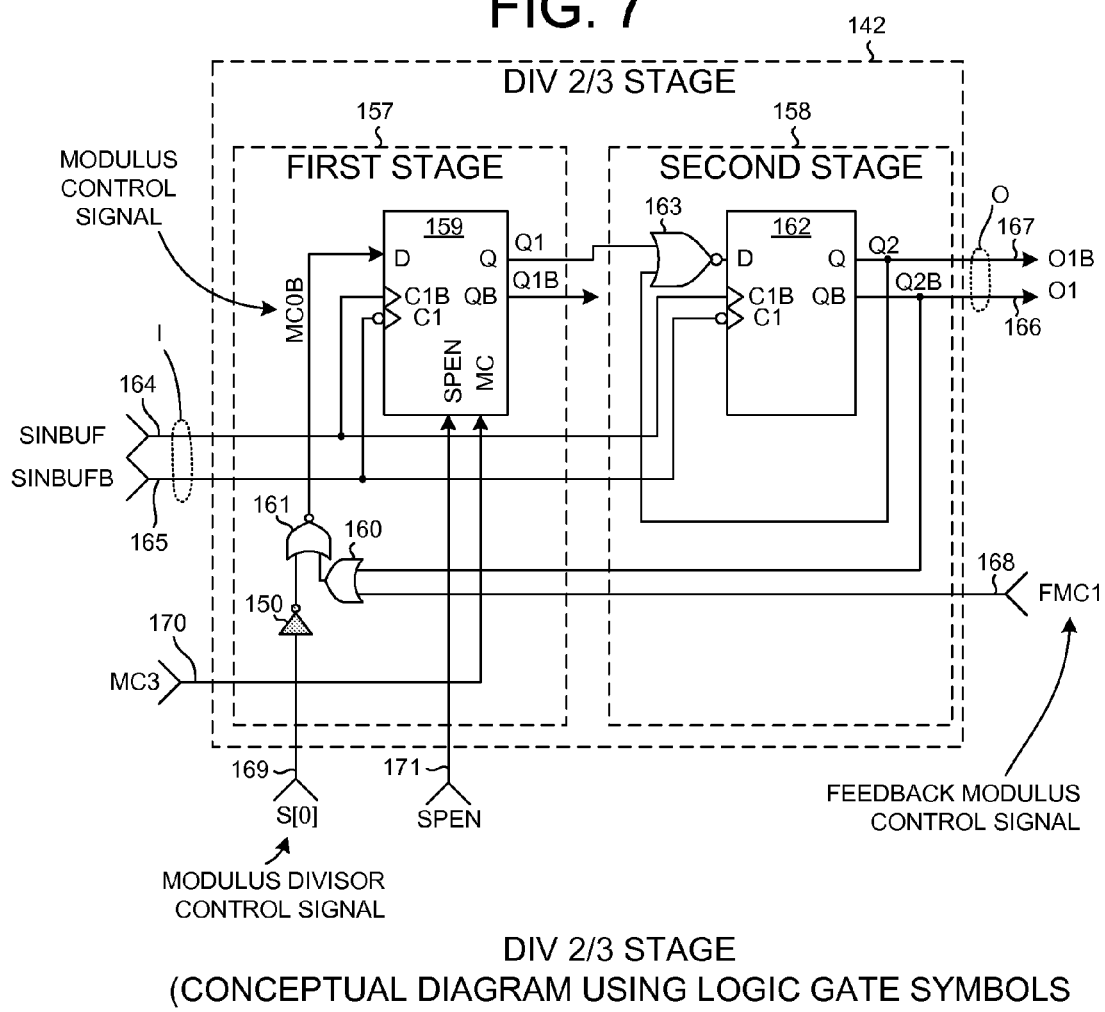

DIVIDE-BY-THREE MODE S[0]=1
DIVIDING BY THREE AND BY TWO

LOW-POWER MODULUS DIVIDER STAGE

CLAIM OF PRIORITY UNDER 35 U.S.C. §119

The present application for patent claims priority to Provisional Application No. 60/817,572 entitled "Low power modulus divider stage" filed Jun. 28, 2006, and assigned to the assignee hereof and hereby expressly incorporated by reference herein.

BACKGROUND INFORMATION

1. Technical Field

The disclosed embodiments relate to multi-modulus dividers (MMDs), and in particular to reducing power consumption in a modulus divider stage (MDS) of an MMD.

2. Background Information

The receiver and transmitter circuitry within a cellular telephone typically includes one or more local oscillators. The function of a local oscillator is to output a signal of a selected frequency. Such a local oscillator in a cellular telephone may, for example, include a phase-locked loop (PLL) that receives a stable but relatively low frequency signal (for example, 20 MHz) from a crystal oscillator and generates the output signal of the selected relatively high frequency (for example, 900 MHz). The feedback loop of the PLL includes a frequency divider that receives the high frequency signal and divides it down to obtain a low frequency signal that is of the same phase and frequency as the signal from the crystal oscillator. A type of divider referred to here a "multi-modulus divider" is often used to realize the frequency divider. Due to the high frequency operation of the frequency divider, the circuitry of the frequency divider may consume an undesirably large amount of power. Techniques and methods for reducing the amount of power consumed by the frequency dividers in the local oscillators are desired.

SUMMARY

A multi-modulus divider (MMD) divides an input signal SIN by a divisor value DV to generate an output signal SOUT. The MMD includes a plurality of modulus divider stages (MDSs) that are chained together to form the MMD. Each MDS (except the last MDS) receives a feedback modulus control signal from the next MDS in the chain. Each MDS also receives a modulus divisor control signal S. If the modulus divisor control signal S for a particular MDS has a first digital logic value then the MDS operates in a divide-by-two mode, otherwise the MDS operates in a divide-by-three mode.

Each MDS includes a first stage and a second stage. In accordance with a first novel aspect, it is recognized that the output of the first stage does not transition when the MDS is operating in the divide-by-two mode. To reduce power consumption of the MDS, the first stage is unpowered during divide-by-two mode operation.

In accordance with a second novel aspect, it is recognized that the function of the first stage during divide-by-three mode operation is to detect the feedback modulus control signal and to supply a clock swallow control pulse onto the control input lead of the second stage at the proper time so as to cause the second stage to perform a divide-by-three operation. In a typical operation of the MMD, an MDS stage in the divide-by-three mode will actually perform a divide-by-three operation only infrequently. Accordingly, power is conserved in accordance with the second novel aspect by powering down the first stage when the MDS is in the divide-by-three mode and the second stage is performing divide-by-two operations.

A method in accordance with one novel aspect involves the following three steps (a)-(c): (a) Using a modulus divider stage (MDS) to divide an input signal by three. The MDS used is controllable to divide the input signal by either two or by three and includes a first stage and a second stage. (b) Powering down the first stage of the MDS without powering down the second stage of the MDS. (c) After the powering down of step (b), using the MDS to divide the input signal by two when the first stage is powered down. In one example of the method, the first stage need not be powered when the MDS is dividing by two. The MDS is in a divide-by-three mode in which the MDS is controlled by a modulus control signal to either divide by two or to divide by three. When a divide-by-three operation is anticipated, the first stage is powered up and is then maintained powered during the divide-by-three operation. After completion of the divide-by-three operation, the first stage is powered down so that it will be in a powered down state during subsequent divide-by-two operations.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 7 sets forth an equation that indicates what the value of S[6:0] should be in order for the seven-stage MMD of FIG. 4 to divide by a desired divisor.

FIG. 8 is a block diagram of one MDS of the MMD of FIG. 4.

DETAILED DESCRIPTION

Figure 1:
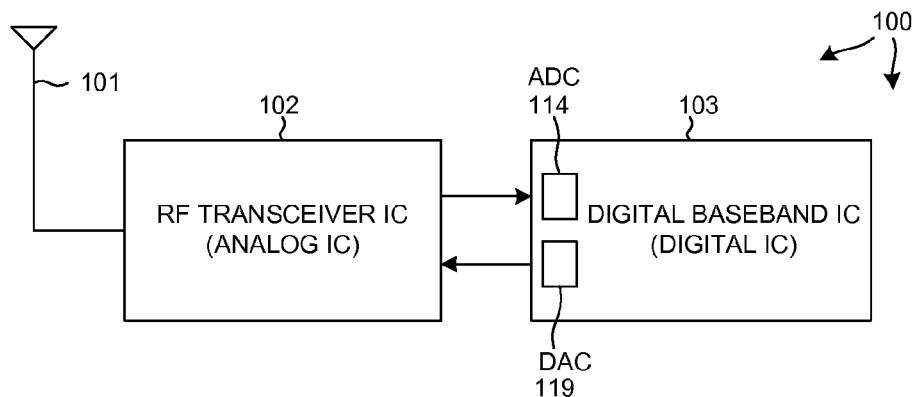
FIG. 1 is a simplified diagram of a mobile communication device (in this example, a cellular telephone) in accordance with one novel aspect.

FIG. 1 is a simplified diagram of a mobile communication device 100 in accordance with one novel aspect. Mobile communication device 100 in this case is a cellular telephone. Cellular telephone 100 includes an antenna 101 and several integrated circuits including a novel radio frequency (RF) transceiver integrated circuit 102 and a digital baseband integrated circuit 103. Digital baseband integrated circuit 103 includes primarily digital circuitry and includes a digital processor. An example of digital baseband integrated circuit 103 is the MSM6280 available from Qualcomm Inc. Novel RF transceiver integrated circuit 102 includes circuits for processing analog signals.

Figure 2:
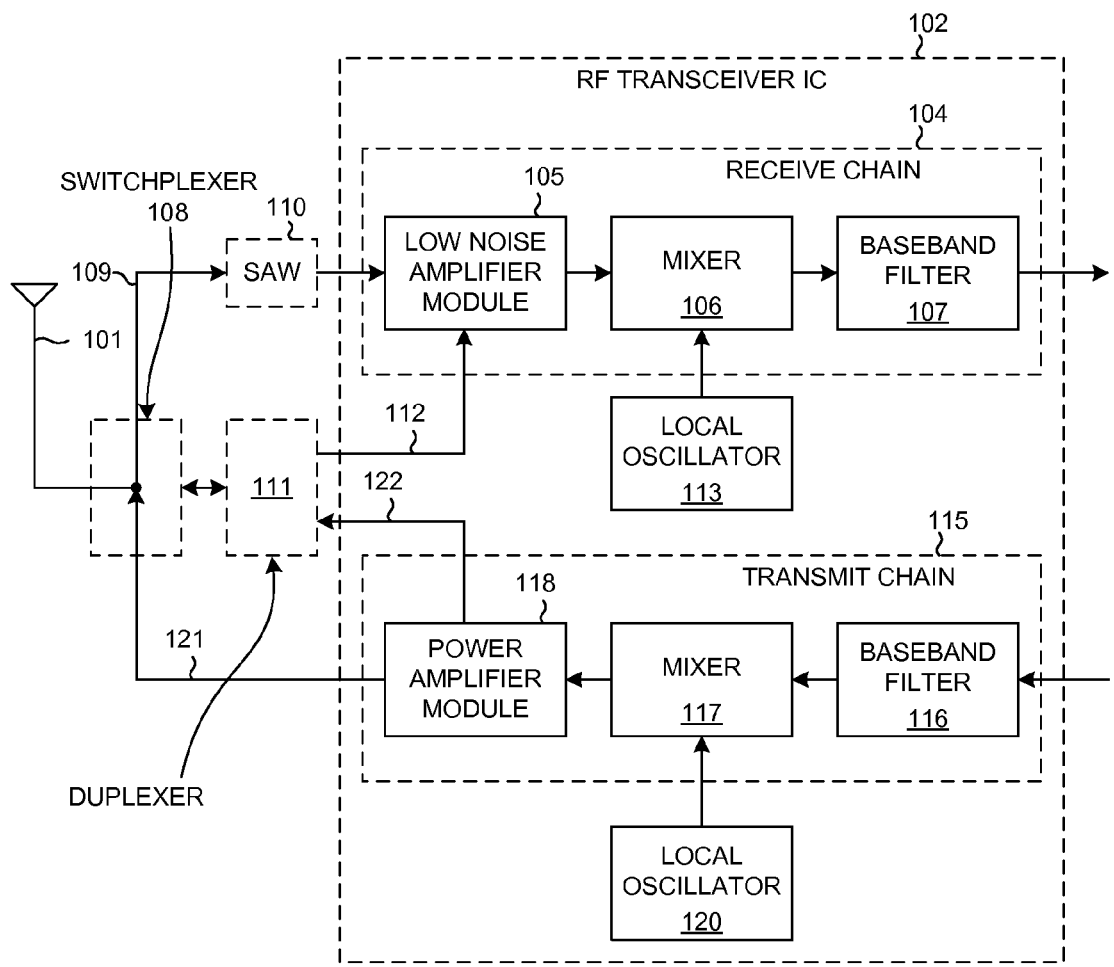
FIG. 2 is a diagram of the RF transceiver integrated circuit within the mobile communication device of FIG. 1.

FIG. 2 is a more detailed diagram of the RF transceiver integrated circuit 102 of FIG. 1. The receiver "signal chain" 104 includes a low noise amplifier (LNA) module 105, a mixer 106, and a baseband filter 107. When receiving in a GSM (Global System for Mobile Communications) mode, a signal on antenna 101 passes through a switchplexer 108 and then through path 109, through a SAW 110 and into LNA 105. When receiving in a CDMA (Code Division Multiple Access) mode, a signal on antenna 101 passes through switchplexer 108, through a duplexer 111, and through path 112 and into LNA 105. In all modes, LNA 105 amplifies the high frequency signal. Local oscillator (LO) 113 supplies a local oscillator signal of an appropriate frequency to mixer 106 so that the receiver is tuned to receive signals of the proper frequency. Mixer 106 demodulates the high frequency signal down to a low frequency signal. Unwanted high frequency noise is filtered out by baseband filter 107. The analog output of baseband filter 107 is supplied to an analog-to-digital converter (ADC) 114 in the digital baseband integrated circuit 103. ADC 114 digitizes the analog signal into digital information that is then processed further by a digital processor in the digital baseband integrated circuit 103.

The transmitter "signal chain" 115 includes a baseband filter 115, a mixer 117 and a power amplifier module 118. Digital information to be transmitted is converted into an analog signal by digital-to-analog converter (DAC) 119 within digital baseband integrated circuit 103. The resulting analog signal is supplied to baseband filter 116 within the RF transceiver integrated circuit 102. Baseband filter 116 filters out unwanted high frequency noise. Mixer 117 modulates the output of baseband filter 116 onto a high frequency carrier. Local oscillator (LO) 120 supplies a local oscillator signal to mixer 117 so that the high frequency carrier has the correct frequency for the channel being used. The high frequency output of mixer 117 is then amplified by power amplifier module 118. When transmitting in the GSM mode, power amplifier module 118 outputs the signal via path 121, through switchplexer 108, and onto antenna 101. When transmitting in a CDMA mode, power amplifier module 118 outputs the signal via path 122 to duplexer 111. The signal passes through duplexer 111, through switchplexer 108, and to antenna 101. The use of duplexer 111 and switchplexer 108 that allow both for non-duplex (for example, GSM) and for duplex (for example, CDMA1X) communication is conventional. The particular circuit of FIG. 2 is just one possible implementation that is presented here for illustrative purposes.

Figure 3:
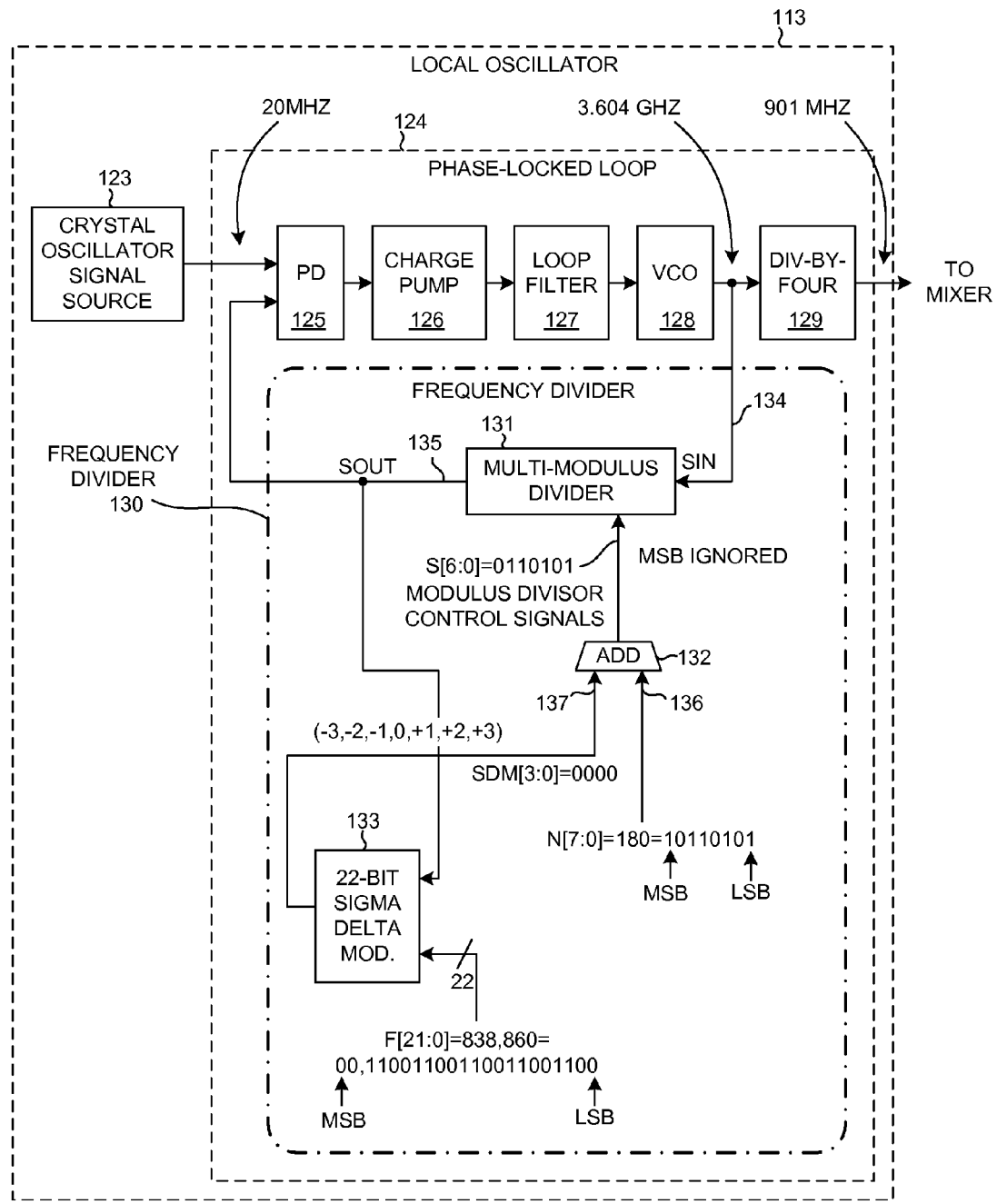
FIG. 3 is a diagram of a local oscillator in the RF transceiver integrated circuit of FIG. 2.

Operation of local oscillators 113 and 120 is explained below in connection with operation of local oscillator (LO) 113 in the receiver. FIG. 3 is a more detailed diagram of local oscillator 113. Local oscillator 113 includes a crystal oscillator signal source 123 and a fractional-N phase-locked loop (PLL) 124. In the present example, the crystal oscillator signal source 123 is a connection to an external crystal oscillator module. Alternatively, the crystal oscillator signal source is an oscillator disposed on RF transceiver integrated circuit 102, where the crystal is external to integrated circuit 102 but is attached to the oscillator via terminals of the integrated circuit 102.

PLL 124 includes a phase-detector (PD) 125, a charge pump 126, a loop filter 127, a voltage controlled oscillator (VCO) 128, a signal conditioning output divider 129, and a novel frequency divider 130 (sometimes called a "loop divider"). Frequency divider 130 receives a frequency divider input signal SIN of a first higher frequency F1, frequency divides the signal by a divisor D, and outputs a frequency divider output signal SOUT of a second lower frequency F2. Over a plurality of count cycles of frequency divider 130, F2=F1/D when the PLL is locked. When locked, the frequency F2 and phase of the SOUT signal matches the frequency and phase of the reference clock signal supplied from crystal oscillator signal source 123.

Frequency divider 130 includes a novel multi-modulus divider (MMD) 131, an adder 132, and a sigma-delta modulator 133. Frequency divider 134 divides the frequency divider input signal SIN on input node(s) 134 by a value DV in a count cycle and generates the frequency divider output signal SOUT on output node(s) 135. The value DV is the sum of a first digital value on first digital input port 136 of adder 132 and a second digital value on second digital input port 137 of adder 132. Sigma delta modulator 133 varies the value on the second digital input port 137 over time such that over multiple count cycles of the MMD, F2=F1/D.

Figure 4:
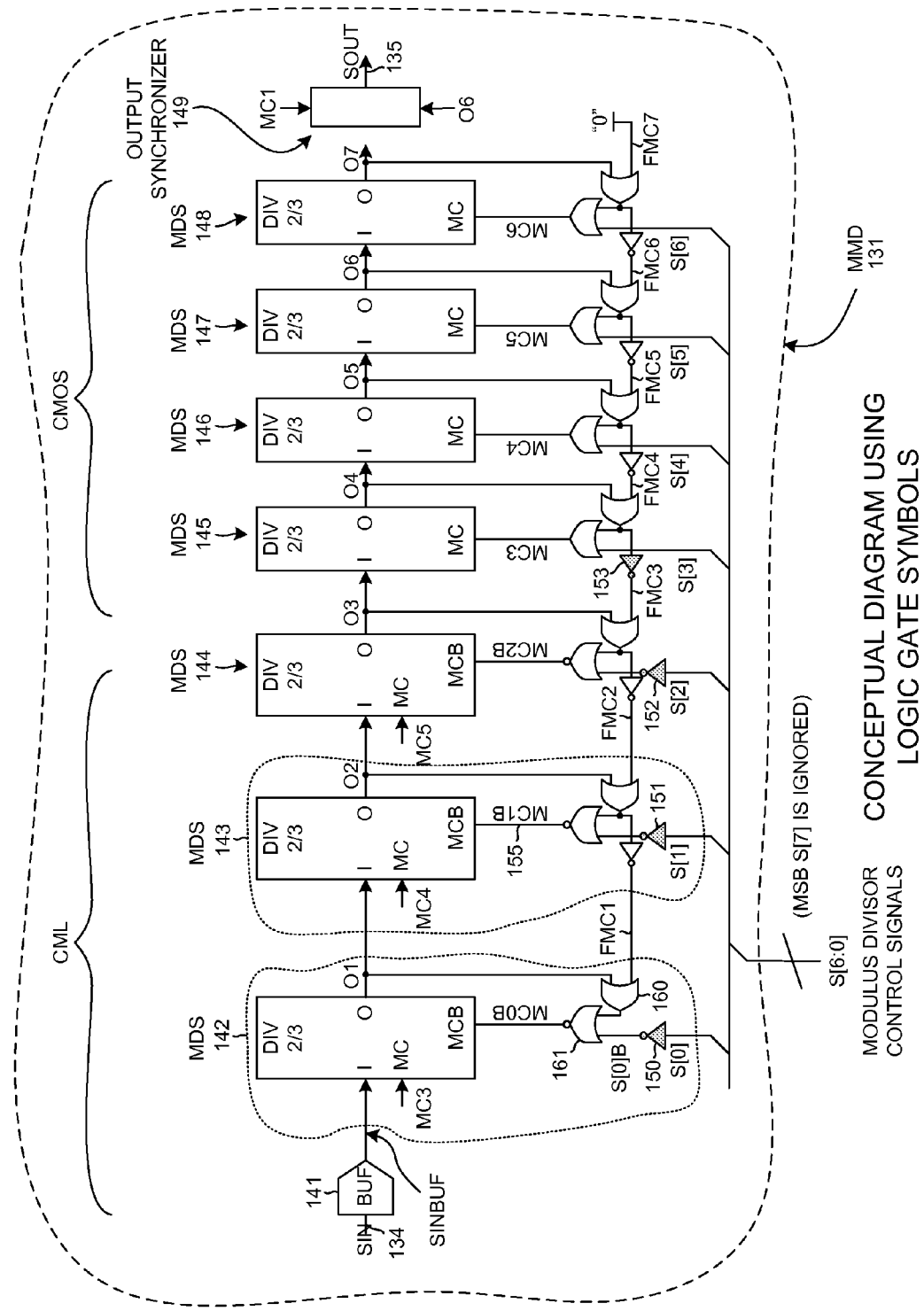
FIG. 4 is a diagram of the frequency divider of the local oscillator of FIG. 3. The frequency divider is a multi-modulus divider (MMD).

High-Level Description of Multi-Modulus Divider:

FIG. 4 is a more detailed diagram of MMD 131 of FIG. 3. MMD 131 includes an input buffer 141, seven multi-modulus divider stages (MDS stages) 142-148, and an output synchronizer 149. The first three MDS stages 142-144 are implemented in current mode logic (CML). The last four MDS stages 145-148 are implemented in complementary metal oxide semiconductor (CMOS) logic. Inverters 150-153 both invert and convert from CMOS logic signals and levels to CML logic signals and levels. Each MDS stage of FIG. 4 can divide by either two or by three depending on the values of a modulus divisor control signal S and a feedback modulus control signal FMC. The letters FMC here stand for "feedback modulus control". The divisor value DV that the overall MMD 131 divides by is determined by the values of the seven S modulus divisor control signals S[6:0].

Figure 5:
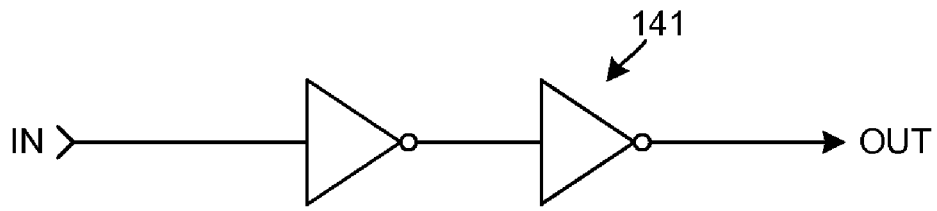
FIG. 5 is a diagram of the input buffer 141 of the MMD of FIG. 4.

FIG. 5 is a more detailed diagram of input buffer 141 of FIG. 4. Each of the two inverters is realized using CML logic. Although the signal lines are illustrated as single signal lines, each of the illustrated signal lines actually represents two physical signal lines. The signals used in the CML logic are differential signals.

Figure 6:
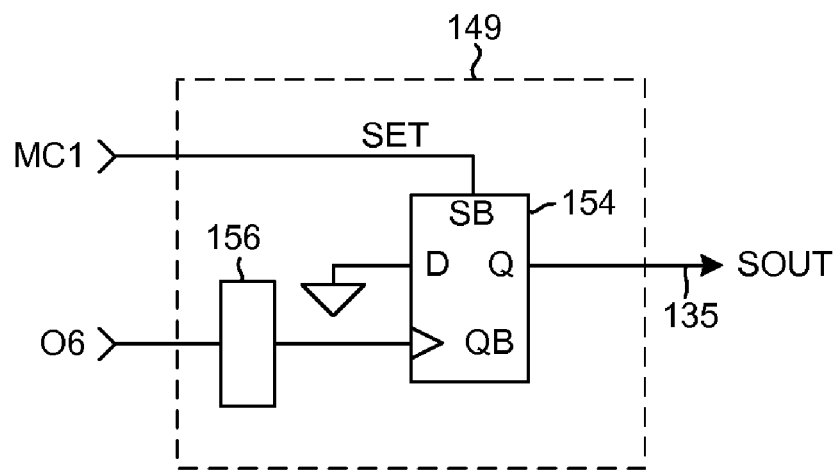
FIG. 6 is a simplified diagram of the output synchronizer 149 of the MMD of FIG. 4.

FIG. 6 is a more detailed diagram of output synchronizer 149 of FIG. 4. Output synchronizer 149 utilizes a self-timing technique to generate the MMD output signal SOUT on output node 135. In a conventional synchronizer (sometimes called a "retiming circuit"), the high speed MMD input signal passing into the MMD is generally the signal used to synchronize the MMD output signal to reduce jitter in the MMD output signal. Using such a high speed signal to do the synchronizing causes the synchronizer to consume a large amount of power. In one advantageous aspect, it is recognized that modulus control signal MC1B of FIG. 4 is a low-jitter signal that transitions high at a time when the period of the desired output signal SOUT should transition. The low-jitter modulus control signal MC1B, however, does not have the 50/50 duty cycle of the desired SOUT signal. (The signal MC1 is the logical inverse of the signal MC1B on conductor 155 in FIG. 4.) It is also recognized that by logically combining one or more of the MDS output signals O1-O7, it is possible to generate a signal that remains low during the first half of the period of the desired signal SOUT, and that first transitions high at a time that is approximately midway in the period of the desired signal SOUT. Accordingly, in the embodiment of FIG. 6, modulus control signal MC1 is supplied to the active low set input lead (SB) of flip-flop 154 to set flip-flop 154. A high-to-low transition of the low-jitter signal MC1 asynchronously sets the signal SOUT high at the desired time. Block 156 represents combinatorial logic. In the present example, O6 is a signal that is low for the first half of the period of the desired SOUT signal, and then transitions high. The low-to-high transition of O6 (which passes through block 156 in this embodiment) serves to clock flip-flop 154, thereby clocking in a digital logic low. The resulting signal SOUT that is output from flip-flop 154 is the desired signal that has the desired frequency and that has a duty cycle that is approximately 50/50. The rising edge of SOUT has low-jitter with respect to the MMD input signal. The high speed MMD input signal (SINBUF) is not used in the synchronizing, thereby reducing power consumption in comparison to a conventional synchronizer. Rather than using MC1 to set flip-flop 154, a corresponding one of the modulus control signals MC2, MC3 or MC4 could have been used. MC2 is of lower frequency content than MC1, but has more jitter relative to SINBUF. Using the lower frequency content signal MC2 to set flip-flop 154 would reduce power consumption in the synchronizer, but would result in the signal SOUT having more jitter. In one novel aspect, the circuit of FIG. 6 allows a power consumption to jitter tradeoff to be had and allows the best compromise to be selected for the particular application to which the MMD is put.

FIG. 7 sets forth an equation that indicates what the modulus divisor control signals S[6:0] should be in order for MMD 131 to divide by a desired divisor value DV. If, for example, MMD 131 is to divide by a divisor value of 181, then S[6:0] should be the value [0110101].

High-Level Description of an MDS Stage:

FIG. 8 is a simplified diagram of the first MDS stage 142 of MMD 134 of FIG. 4. The first MDS stage 142 has a structure that is representative of the structures of the other MDS stages 143-148. First MDS 142 includes a first stage 157 and a second stage 158. First stage 157 includes a D-type flip-flop 159, an OR gate 160, a NOR gate 161, and an inverter 150. The OR gate 160, NOR gate 161 and inverter 150 of FIG. 8 are the same OR gate 160, NOR gate 161 and inverter 150 of FIG. 4. As described in further detail below, the functionality of gates 160 and 161 can be incorporated into the circuitry of flip-flop 159 where flip-flop 159 is a CML flip-flop.

Second stage 158 includes a D-type flip-flop 162 and a NOR gate 163. As described in further detail below, the functionality of gate 163 can be incorporated into the circuitry of flip-flop 162 where flip-flop 162 is a CML flip-flop. MDS stage 142 receives an input signal SINBUF on input lead(s) I 164 and 165 and outputs an output signal O1 on output lead(s) O 166 and 167. Input lead 168 is an input lead for receiving the feedback modulus control signal FMC1 from second MDS stage 143. Input lead 169 is an input lead for receiving the modulus divisor control signal S[0] that determines whether MDS 142 will be in a "divide-by-two mode" or will be in a "divide-by-three mode". Input leads 170 and 171 are used to receive signals for powering down and up flip-flop 159 as explained in further detail below. In operation, if modulus divisor control signal S[0] is a digital logic low, then MDS stage 142 is in the divide-by-two mode. If, one the other hand, modulus divisor control signal S[0] is a digital logic high, then MDS 142 is in the "divide-by-three mode". In the divide-by-three mode, MDS 142 either divides by two or three depending on the state of flip-flop 162 and the logic level of feedback modulus control signal FMC1. If both feedback modulus control signal FMC1 and the Q2B signal output from flip-flop 162 have digital logic low levels, then MDS 142 divides by three during the next three periods of input signal SINBUF. If both feedback modulus control signal FMC1 and the Q2B signal output from flip-flop 162 are not at digital logic low levels, then stage 142 divides by two.

Figure 9:
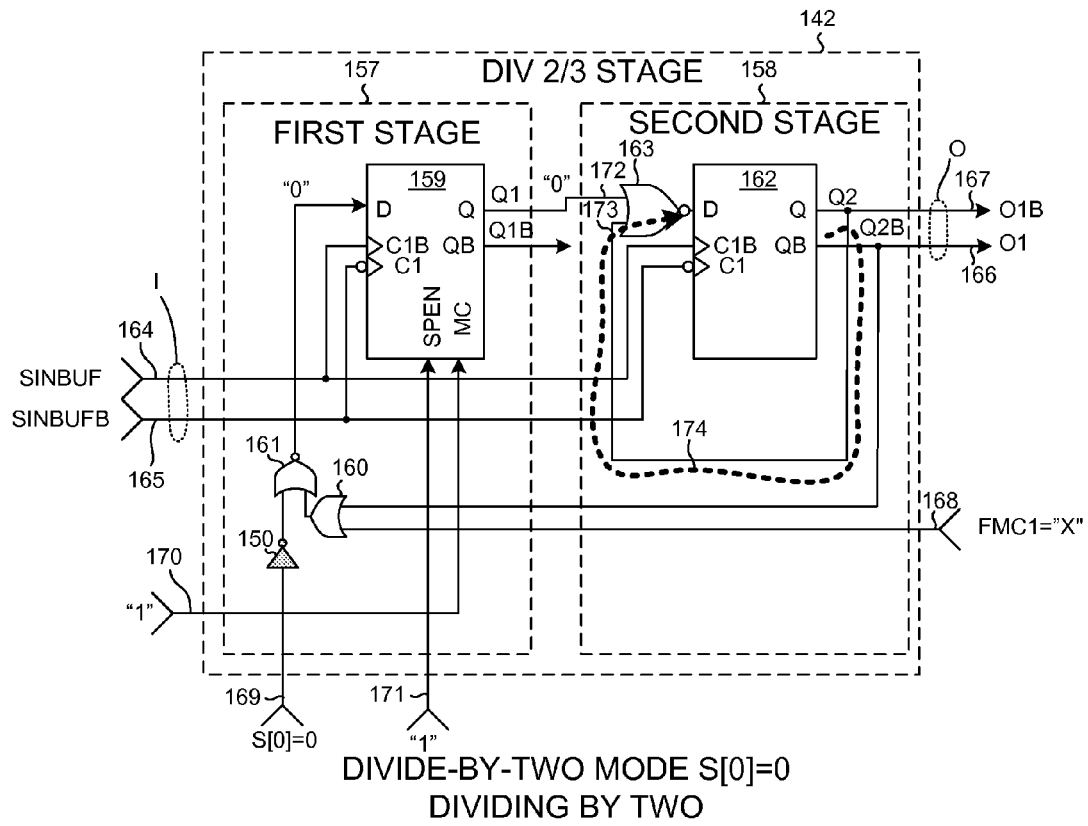
FIG. 9 is a diagram that illustrates how the MDS of FIG. 8 can operate to divide an input signal SINBUF by two.

FIG. 9 is a circuit diagram that illustrates how MDS stage 142 divides by two if modulus divisor control signal S[0] is a digital logic low level. If S[0] is a digital logic low, then NOR gate 161 outputs a digital logic low regardless of any other signal values. NOR gate 161 therefore outputs a digital logic low onto the D-input lead of flip-flop 159. As flip-flop 159 is clocked, the digital logic low on the D-input lead is repeatedly clocked into flip-flop 159 such that the Q1 signal output from flip-flop 159 is maintained at a digital logic low level. A digital low value therefore remains on the upper input lead 172 of NOR gate 163 as indicated by the "0" on the upper input lead 172 of NOR gate 163 in FIG. 9. Accordingly, the Q signal output by flip-flop 162 is therefore communicated back through the lower input lead 173 of NOR gate 163, through NOR gate 163, and to the D-input lead of flip-flop 162. This signal path is indicated in FIG. 9 by dashed line 174. Because the Q output lead of flip-flop 162 is coupled to the D-input lead of flip-flop 162 through NOR gate 163, the feedback loop inverts and flip-flop 162 operates as a toggle flip-flop. Flip-flop 162 of second stage 158 therefore toggles and divides the input signal on input leads 164 and 165 by two and outputs the resulting signal onto output leads 166 and 167. In contrast to this, flip-flop 159 of first stage 157 does not change state and simply holds the digital logic low value on the upper input lead 172 of NOR gate 163.

Figure 10:
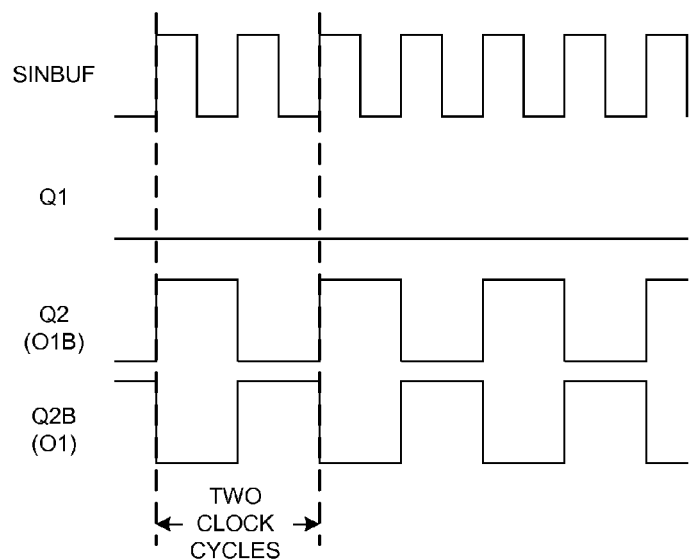
FIG. 10 is a waveform diagram that illustrates signals in the operation of the MDS of FIG. 9.

FIG. 10 is a simplified waveform diagram that shows the operation of MDS stage 142 in the divide-by-two mode. As explained above, the Q1 signal output from flip-flop 159 of the first stage does not change state. Flip-flop 162 of the second stage toggles to divide the input signal SINBUF by two.

Figure 11:
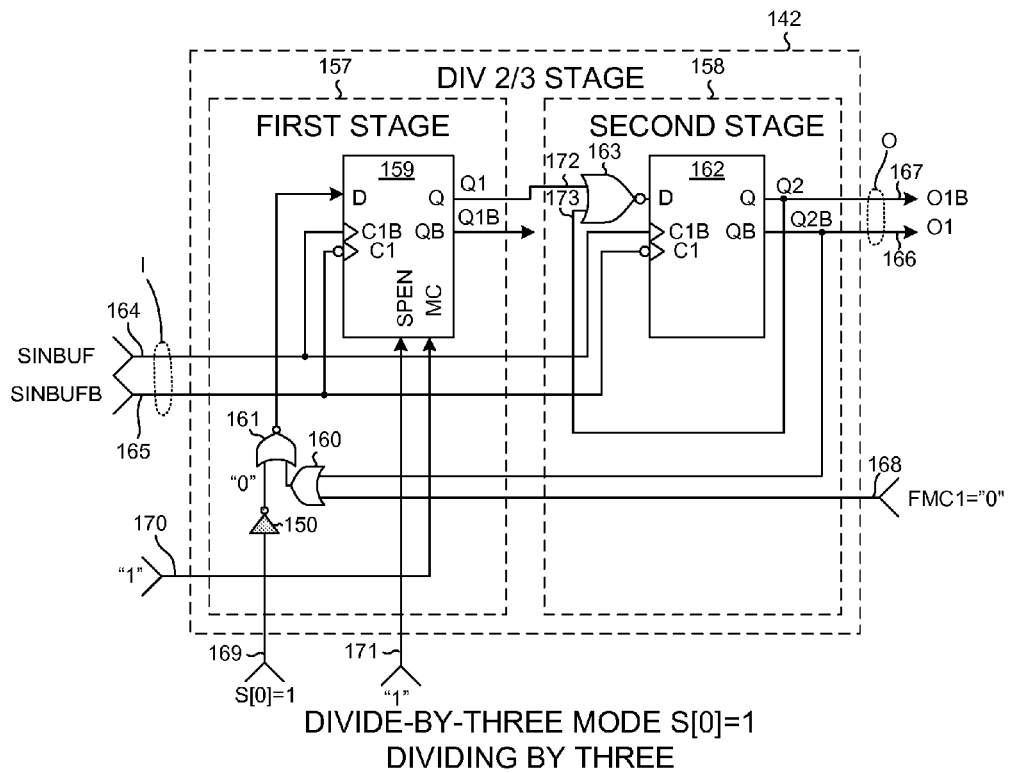
FIG. 11 is a diagram that illustrates how the MDS of FIG. 8 can operate to divide an input signal SINBUF by three.

FIG. 11 is a circuit diagram that illustrates how MDS 142 divides an input signal SINBUF on input leads 164 and 165 by three if modulus divisor control signal S[0] is a digital logic high level. Initially, assume that flip-flop 159 is set to store a digital logic low state and assume that flip-flop 162 is set to store a digital logic high state. Signal Q1 is therefore a digital logic low value and signal Q2 is a digital logic high value. Initially, also assume that feedback control signal FMC1 is a digital logic low level. Because S[0] is a digital logic low high value, because FMC1 is a digital logic low value, and because the Q2B signal output from flip-flop 162 is a digital logic low level, NOR gate 161 outputs a digital logic high level onto the D-input lead of flip-flop 159. Because the Q1 signal output by flip-flop 159 is a digital logic low value, NOR gate 163 inverts the value of the signal Q2 output by flip-flop 162. Accordingly, on the next rising edge of the SINBUF signal that clocks the flip-flops, flip-flop 159 of the first stage clocks in the digital logic high value such that signal Q1 becomes a digital logic high value. At the same time, flip-flop 162 clocks in a digital logic low value such that signal Q2 becomes a digital logic low value and signal Q2B becomes a digital logic high value.

After the clock edge, signal Q2B is a digital logic high level. NOR gate 160 therefore outputs a digital logic high value, and NOR gate 161 outputs a digital logic low value. On the next rising edge of the clock signal SINBUF, flip-flop 159 clocks in this digital logic low value. The signal Q1 therefore transitions to a digital logic low level. Prior to this rising edge of the clock signal, a digital logic low was present on the D-input of flip-flop 162. On the rising edge of the clock signal SINBUF, flip-flop 162 continues to drive signal Q2 to a digital low. Signal Q2B remains a digital logic high value. It is therefore seen that toggling of the flip-flop 162 of the second stage 158 is effectively suspended, and the signal Q2B output from flip-flop 162 remains at the digital logic high value for two SINBUF periods.

After this rising edge of the clock signal, the Q1 signal output by flip-flop 159 is at a digital logic low. NOR gate 163 again functions to invert the signal Q2 and to supply the inverted version of Q2 onto the D-input lead of flip-flop 162. The Q2 signal has a digital logic low logic level. Accordingly, on the next rising edge of the clock signal SINBUF, flip-flop 162 resumes its toggling such that signal Q2 transitions to a digital logic high value. The count cycle therefore repeats because Q1 is now a digital logic low value, and Q2B is a digital logic low value. It is therefore recognized that the upper input lead 172 of NOR gate 163 is a "control input lead" of the second stage 158 in the sense that a digital logic low level signal on this control input lead allows flip-flop 162 to toggle, whereas a digital logic high level signal on this control input lead when the Q2 signal is a digital logic low value after the next rising edge of SINBUF.

Figure 12:
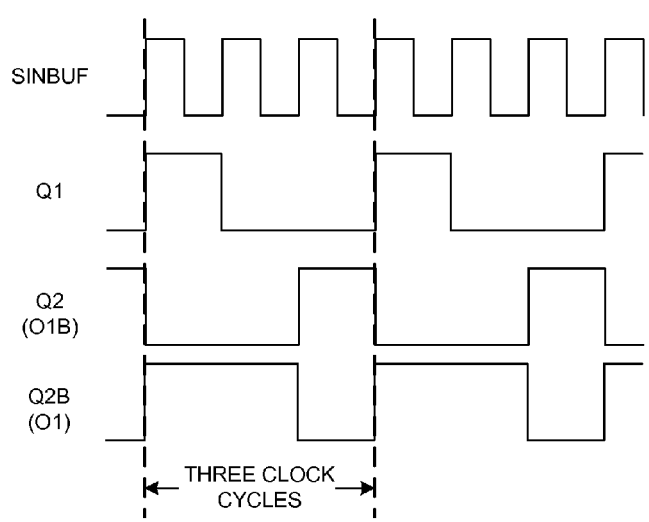
FIG. 12 is a waveform diagram that illustrates signals in the operation of the MDS of FIG. 11.

FIG. 12 is a simplified waveform diagram that shows the operation of MDS stage 142 when S[0]=1 and FMC1=0. The period of the input signal SINBUF on input lead 164 is three times the period of the output signal Q2B on output lead 166.

Note that in the operational examples of FIG. 11, the feedback modulus control signal FMC1 has a digital logic low value. If, on the other hand, the feedback modulus control signal FMC1 had a digital logic high value, then the signal output by NOR gate 161 would be a digital logic low value, regardless of the values of the other signals S[0] and Q2B. If FMC1 were a digital logic high value, then flip-flop 159 would clock in a digital logic low value, flip-flop output signal Q1 would be a digital logic low value, and the second stage 158 would operate as a toggle flip-flop. Accordingly, the feedback modulus control signal FMC1 being a digital logic high value forces the MDS stage 142 to divide by two, regardless of the value of S[0]. If, however, the feedback modulus control signal FMC1 has a digital logic low value, then the MDS stage either divides by two or divides by three depending on the value of S[0].

Figure 13:
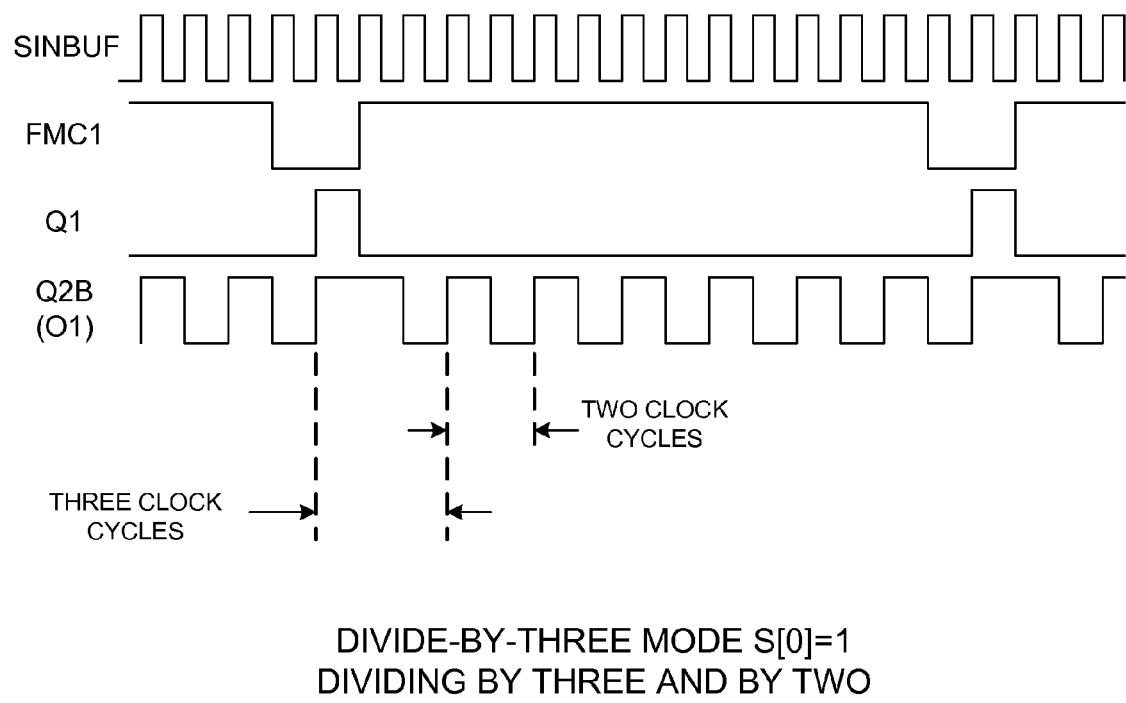
FIG. 13 is a diagram of representative waveforms of input signals FMC1 and SINBUF and output signals Q1 and Q2B when the first MDS 142 of the MMD of FIG. 4 is operating in the divide-by-three mode.

FIG. 13 is a diagram of representative waveforms of input signals FMC1 and SINBUF and output signals Q1 and Q2B of the first MDS stage 142 when MDS stage 142 is operating in MMD 131 of FIG. 4. Because S[0]=1, MDS stage 142 is in the divide-by-three mode. Most of the time, feedback control signal FMC1 is at a digital logic high value as illustrated. As can be seen from FIG. 11, OR gate 160 outputs a digital logic high value, and NOR gate 161 outputs a digital logic low value, regardless of the values of the signals. A digital logic low value is therefore present on the D-input lead of flip-flop 159. This digital logic low value is clocked into flip-flop 159 and is present on the upper input lead 172 of NOR gate 163. NOR gate 163 therefore functions to invert the value of the signal Q2 and to present the inverted version of the signal Q2 onto the D-input lead of flip-flop 162. The second stage 158 therefore functions as a toggle flip-flop. The period of the Q2B signal output by the second stage is twice the period of the input clock signal SINBUF. The circuit therefore divides by two for most of the time, despite the fact that MDS stage 142 is in the divide-by-three mode.

If the feedback control signal FMC1 is pulsed to a digital logic low level as indicated in FIG. 13 due to the operation of higher MDS stages of MMD 131, then when signal Q2B is at a digital logic low level, OR gate 160 will output a digital logic low value and digital logic low values will be on both input leads of NOR gate 161. NOR gate 161 will output a digital logic high value. On the next rising edge of SINBUF, flip-flop 159 clocks in this digital logic high value. As explained above in connection with FIG. 12, this places a digital logic high value onto the upper input lead 172 of NOR gate 163. On the next rising edge of SINBUF, rather than the flip-flop 162 of the second stage 158 toggling, a logical low value is clocked into flip-flop 162. This digital logic low is the same state that flip-flop 162 was in prior to the rising edge of SINBUF. Accordingly, the toggling of flip-flop 162 is suspended. The Q1 signal, however, does transition back down to a digital logic low level because Q2B was a digital logic high level prior to the rising edge of SINBUF. As seen in FIG. 13, signal FMC1 also transitions back up to a digital logic value. On the next rising edge of SINBUF, flip-flop 162 of the second stage 158 resumes toggling because a digital logic low is present on the upper input lead 172 of NOR gate 163. The signal Q2 therefore transitions to a digital logic high and the signal Q2B transitions to a digital logic low. Accordingly, pulsing FMC1 low causes the MDS stage 142 to perform a divide-by-three operation as indicated in the waveform of FIG. 13. Otherwise, MDS stage 142 performs divide-by-two operations. Due to the way the MMD circuit of FIG. 4 generates the feedback control signal FMC1, MDS 142 may perform a divide-by-three operation only periodically, even though MDS 142 is in the "divide-by-three mode".

Figure 14:
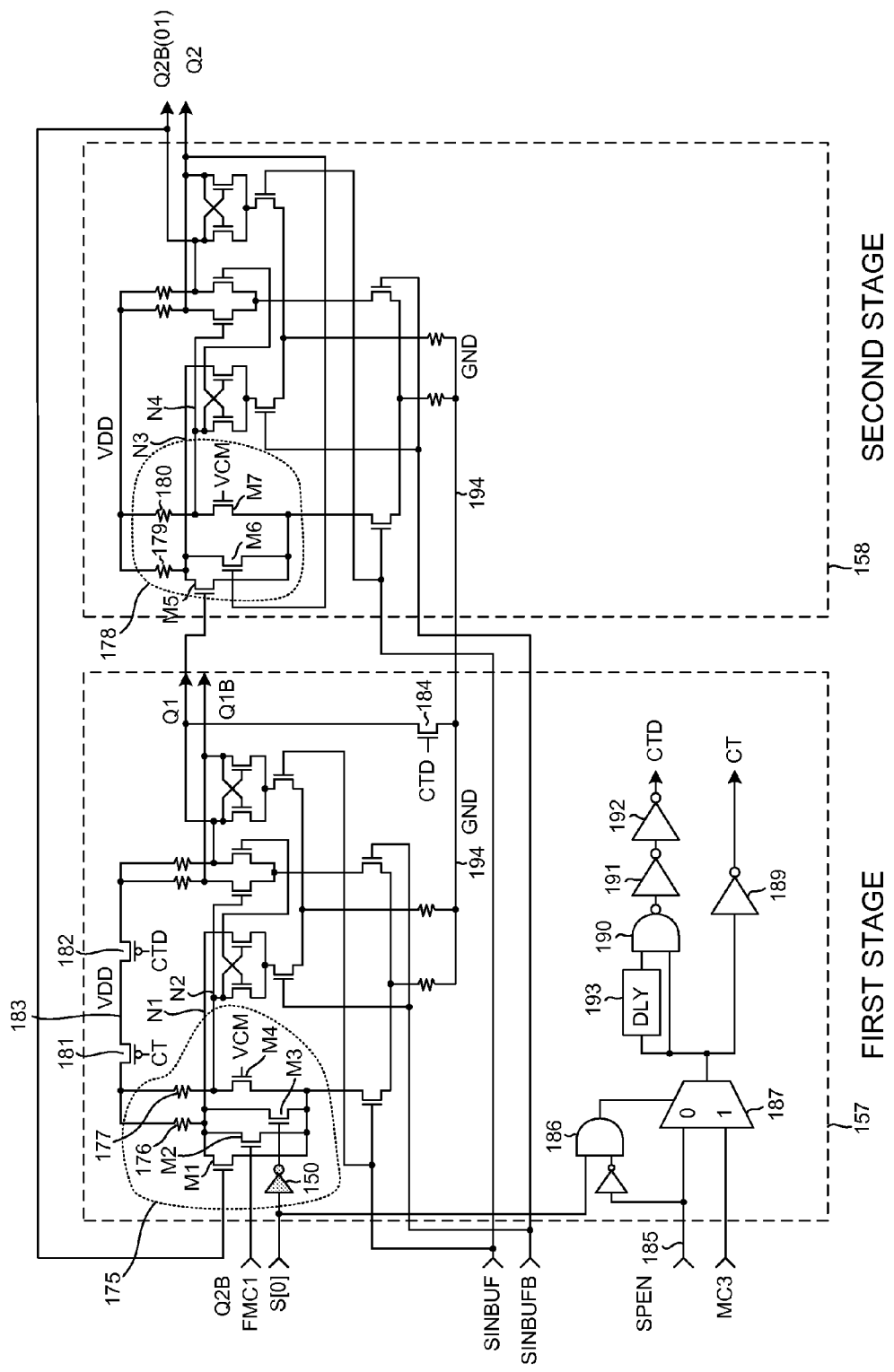
FIG. 14 is a detailed transistor-level circuit diagram of the MDS 142 of the MMD of FIG. 4.

Low-Level Circuit Description of an MDS Stage:

FIG. 14 is more detailed transistor-level circuit diagram of MDS 142 realized in CML logic. Dashed line 157 encloses the transistor-level structure of first stage 157 of FIG. 8. Dashed line 158 encloses the transistor-level structure of second stage 158 of FIG. 8. The logic of OR gate 160, inverter 150, and NOR gate 161 of FIG. 8 is built into the CML structure of the flip-flop of first stage 157. Dashed line 175 in FIG. 14 circles this logic. Node N1 is the data node of the first stage of the flip-flop 159 of first stage 157. Node N2 is a differential comparison node. Any one of the N-channel pull-down transistors M1, M2 and M3 can be made conductive to pull node N1 down. If none of these transistors M1, M2 and M3 is conductive, then pullup resistor 176 maintains node N1 at a digital logic high value. Pullup resistor 177 is the pullup resistor for the differential comparison node N2. The bias voltage VCM on the gate of transistor M4 biases node N2. If the voltage on node N1 is lower than the voltage on differential comparison node N2, then the first stage of the flip-flop is set at a first state. If, on the other hand, the voltage on node N1 is higher than the voltage on differential comparison node N2, then the first stage of the flip-flop is set at a second state. The structure within dashed line 175 is therefore a wired-NOR type structure having three signal inputs, Q2B, FMC1 and the logical inverse of S[0].

The logic of NOR gate 163 of FIG. 8 is built into the CML structure of the flip-flop of second stage 158. Dashed line 178 in FIG. 14 circles this logic. N-channel transistors M5 and M6 are pulldown transistors that can pull node N3 down. Resistor 179 is a pullup resistor for node N3. Bias voltage VCM controls transistor M7 to bias differential comparison node N4. Resistor 180 is the pullup resistor for differential comparison node N4. If the voltage on node N3 is lower than the voltage on differential comparison node N4, then the first stage of the flip-flop is set at a first state. If, on the other hand, the voltage on node N3 is higher than the voltage on differential comparison node N4, then the first stage of the flip-flop is set at a second state. The structure within dashed line 178 is therefore a wired-NOR type structure having two signal inputs, Q1 and Q2.

Flip-flop 159 of first stage 157 can be disabled such that the flip-flop does not transition states, thereby reducing power consumed by the flip-flop when it is clocked. There are two P-channel transistors 181 and 182 that are disposed in the path of supply current from the supply voltage VDD source conductor 183 to the various pullup resistors of the CML circuitry. If signals CT and CTD (CT delayed) are digital logic high values, then these transistors 181 and 182 are non-conductive. If transistors 181 and 182 are non-conductive, then the supply voltage VDD conductor 183 is disconnected from the flip-flop circuitry.

If the flip-flop of first stage 157 were to be disabled and unpowered in this way, then the output Q1 of first stage 157 should not be left floating at an undetermined value. An N-channel power-down transistor 184 is therefore provided to couple the Q1 output node to ground conductor 194 if the disable signal CTD is at a digital logic high. Coupling the Q1 output node to ground conductor 194 maintains the Q1 signal at a digital logic low level during the time first stage 157 is powered down.

Power enable override signal SPEN on input lead 185 is an active signal. If SPEN is a digital logic high, then AND gate 186 outputs a digital logic low, thereby causing 2-to-1 multiplexer 187 to select the digital logic high value on its upper data input lead. This digital logic high value is inverted by inverter 189 such that signal CT is forced and maintained at a digital logic low level. This maintains the first stage 157 in an enabled and powered state regardless of the values of the other control signals S[0] and MC3. Similarly, the digital logic high value output by multiplexer 187 causes the signal CTD to be maintained at a digital logic low level. SPEN is therefore called a "power enable override signal".

It is recognized that first stage 157 of MDS 142 does not transition state when the MDS 142 is in the "divide-by-two mode" as explained above in connection with FIGS. 9 and 10. Rather, the Q1 signal that is output by first stage 157 is always at a digital logic low level as indicated in FIG. 10. In one novel aspect, if MDS 142 is in the divide-by-two mode and SPEN is not asserted (i.e., is a digital logic low level), then the flip-flop of first stage 157 is disabled and is unpowered. Power-down transistor 184 is made conductive, thereby putting the desired digital logic low value onto the Q1 output lead of the first stage 157. This occurs because if S[0] is a digital logic low, then AND gate 186 outputs a digital logic low onto the select input lead of 2-to-1 multiplexer 187. Multiplexer 187 therefore couples the multiplexer's upper data input lead (denoted "0") to the multiplexer output lead. Because SPEN is a digital logic low, a digital logic low value passes through multiplexer 187, and is inverted by inverter 189 such that signal CT is a digital logic high value. If CT is a digital logic high value, then transistor 181 is non-conductive and power-down transistor 184 is conductive. Similarly, if multiplexer 187 is outputting a digital logic low, then NAND gate 190 outputs a digital logic level high, inverter 191 outputs a digital logic level low, and inverter 192 outputs a digital logic level high. Accordingly, shortly after the signal CT makes transistor 181 nonconductive, signal CTD transitions to a digital logic level high and transistor 182 is made non-conductive. The supply voltage VDD conductor 183 is therefore decoupled from the pullup resistors of the stage 157 in a staggered manner to reduce the magnitude of changes in supply current flowing into the flip-flop. When CT and CTD are digital logic level high values, the first stage 157 is disabled an unpowered.

Figure 15:
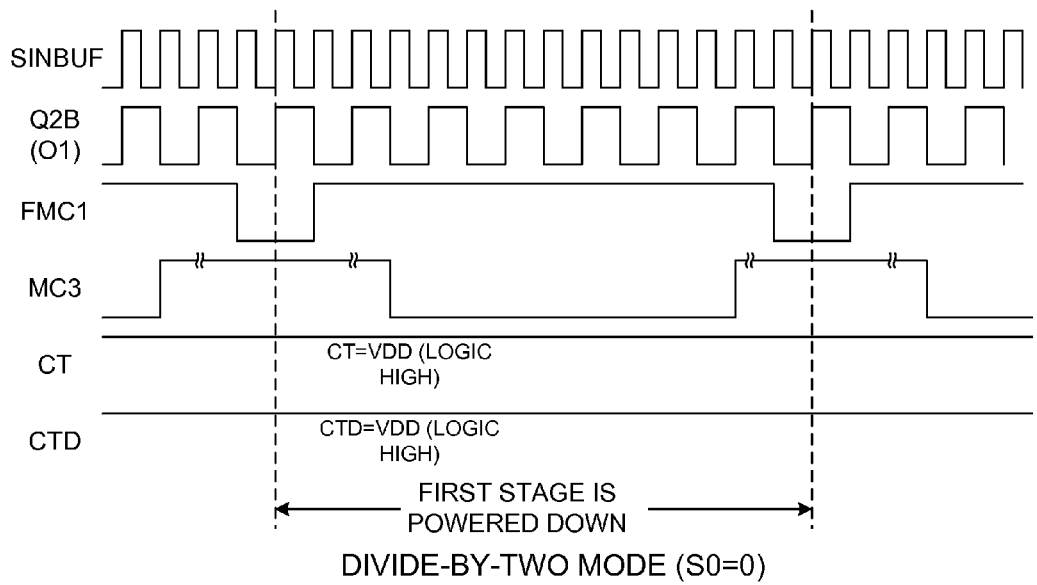
FIG. 15 is a simplified waveform diagram that illustrates an operation of the MDS of FIG. 14 in the divide-by-two mode.

FIG. 15 is a simplified waveform diagram illustrating operation of MDS 142 in the divide-by-two mode (S[0]=0) when SPEN is a digital logic low level. Signals CT and CTD are digital logic high levels. First stage 157 of MDS 142 is therefore disabled and unpowered even though second stage 158 remains powered and functions to divide the SINBUF input signal by two.

It is also recognized that first stage 157 of MDS 142, when operating in the "divide-by-three mode" (S[0]=1), only transitions state at the beginning of a divide-by-three operation. If MDS 142 is in the divide-by-three mode, but is not being controlled to perform a divide-by-three operation, then the Q1 signal that is output by flip-flop 159 remains at a digital logic low level.

Figure 16:
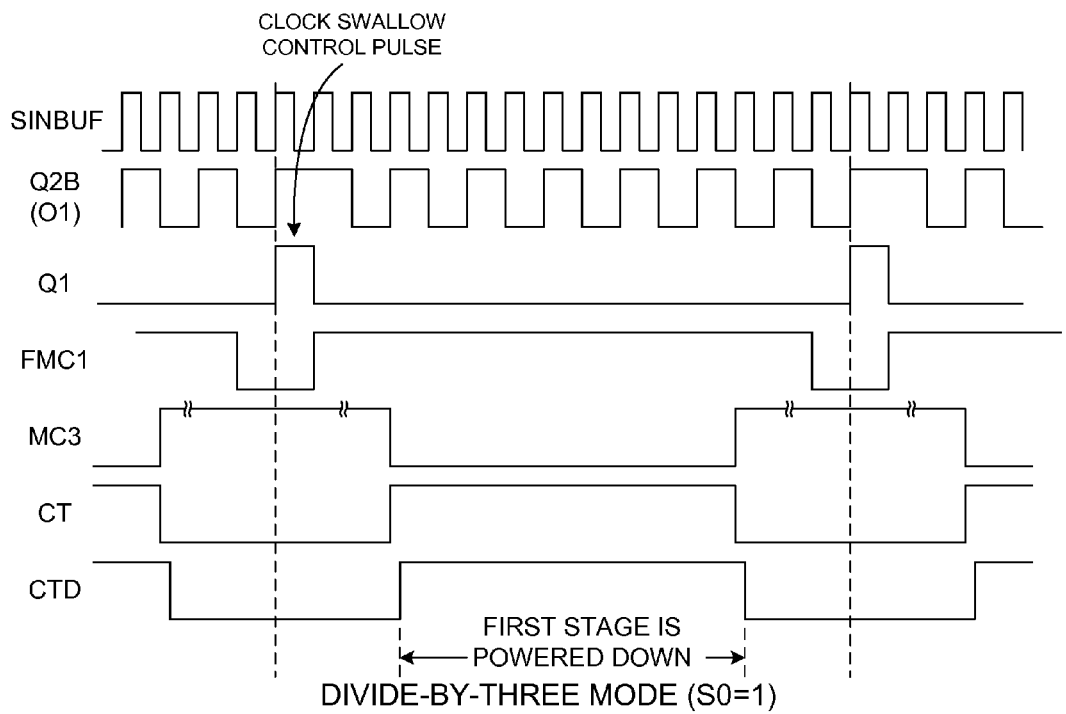
FIG. 16 is a simplified waveform diagram that illustrates an operation of the MDS of FIG. 14 in the divide-by-three mode.

FIG. 16 is a simplified waveform diagram illustrating operation of MDS 142 in the divide-by-three mode (S[0]=1) in a typical scenario where for the majority of the time the feedback control signal FMC1 is not controlling MDS 142 to perform a divide-by-three operation. MDS 142 therefore performs divide-by-two operations for the majority of the time. The only function of the flip-flop of first stage 157 is to detect when the signal FMC1 is a digital logic low level, and to assert a high pulse of the signal Q1 onto the upper input lead 172 of NOR gate 163 (see FIG. 11). As explained in connection with FIGS. 11 and 12 above, asserting a digital logic high value onto the upper input lead 172 of NOR gate 163 causes NOR gate 163 to assert a digital logic low value onto the D-input lead of flip-flop 162 of the second stage. This causes flip-flop 162 of the second stage to clock in a digital logic low value on the next rising edge of SINBUF. The result is that flip-flop 162 of the second stage is forced to maintain its Q2B output signal (O1) at a digital logic high value for one more clock cycle, rather than toggling its Q2B output signal to a digital logic low value on the next transition of the clock signal. The forcing of the second stage to suspend divide-by-two operation for one input clock period and to maintain its state for one more clock signal in response to the FMC1 signal is sometimes referred to as "clock swallowing". The high pulse of Q1 is therefore referred to as a "clock swallow control pulse" because it causes the second stage 158 to perform the clock swallowing operation. The detecting of the low FMC1 pulse that initiates the clock swallowing and the resulting generation of the "clock swallow control pulse" is the function of first stage 157.

Due to the operation of the MDS stages of MMD 331, the modulus control signal MC3 is a signal that transitions high a few clock periods before the low pulse of FMC1 and that transitions back low a few clock periods after the low pulse of FMC1. The modulus control signal MC3 is therefore conveniently used to power up first stage 157 such that the first stage is powered and is outputting the proper low value of the signal Q1 before the low pulse of FMC1 is received onto the first stage 157. When the low pulse of FMC1 is received, the now powered first stage 157 can detect this low FMC1 pulse and can generate the clock swallow control pulse of Q1 as illustrated in FIG. 16. Only after the first stage 157 has output the clock swallow control pulse of the signal Q1 and first stage 157 has returned the value of the Q1 signal to a digital logic low value as indicated in FIG. 16, does the MC3 signal return to a digital logic low value. The digital logic low level of the signal MC3 can also be used to hold the Q1 output of the unpowered first stage at the proper digital logic low level by turning pulldown transistor 184 on (see FIG. 14). If the signal MC3 is used to control when the first stage is powered, then (see the waveform of FIG. 16) first stage 157 will be powered up in advance of the time when it should capture the low pulse of FMC1, it will remain powered during the amount of time that first stage 157 should output the clock swallow control pulse of Q1, it will be powered down shortly after the first stage has returned the value of signal Q1 to a digital logic low level, and due to transistor 184 being turned on it will hold the value of signal Q1 at the proper digital logic low value when the first state is unpowered. Accordingly, in one novel embodiment, the signals CT and CTD are made to be logical inverses of the MC3 signal.

Returning to FIG. 14, if S[0] is a digital logic high level (divide-by-three mode) and if the power override signal SPEN is not asserted (SPEN=0), then AND gate 186 outputs a digital logic high value. This digital logic high value on the select input of 2-to-1 multiplexer 187 causes multiplexer 187 to select its lower data input lead. The signal MC3 that is supplied to the lower data input lead (denoted "1") of multiplexer 187 passes through multiplexer 187 and is inverted by inverter 189 to generate the signal CT. The signal MC3 as output from multiplexer 187 passes through delay element 193 and logic gate 190 and inverters 191 and 192 such that the signal CTD is a delayed version of signal CT as indicated in FIG. 16. When the signals CT and CTD are digital logic low values, the flip-flop of first stage 157 is powered. When the CT and CTD signals are digital logic high values, the flip-flop of first stage 157 is unpowered. By unpowering first stage 157 in the divide-by-three mode when first stage 157 is actually performing divide-by-two operations, power consumption of MMD 131 is reduced.

Figure 17:
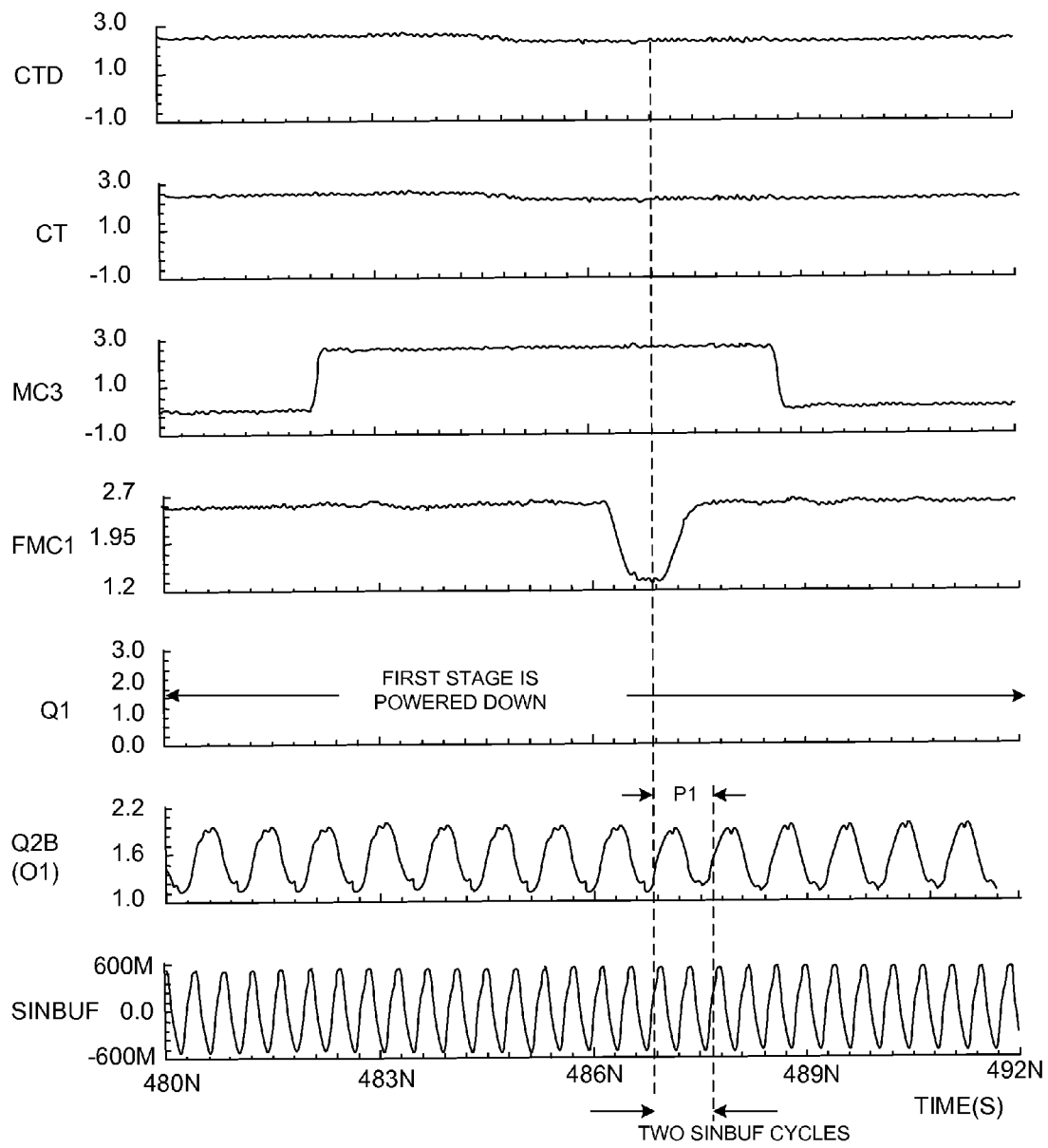
FIG. 17 is a detailed waveform diagram of an operation of the MDS of FIG. 14 in the divide-by-two mode.

FIG. 17 is a more detailed waveform diagram of an operation of MDS 142 of FIG. 14 when MDS 142 is in the divide-by-two mode (S[0] is a digital logic low). The power enable override signal SPEN is not asserted. Because S[0]=0, the signals CT and CTD are digital logic high values. The flip-flop of first stage 157 is unpowered, and its Q1 output signal is held at ground potential by conductive power-down transistor 184. The flip-flop of second stage 158 repeatedly toggles, thereby dividing the input signal SINBUF by two. Note that the period P1 of output signal Q2B is twice the period of input signal SINBUF.

Figure 18:
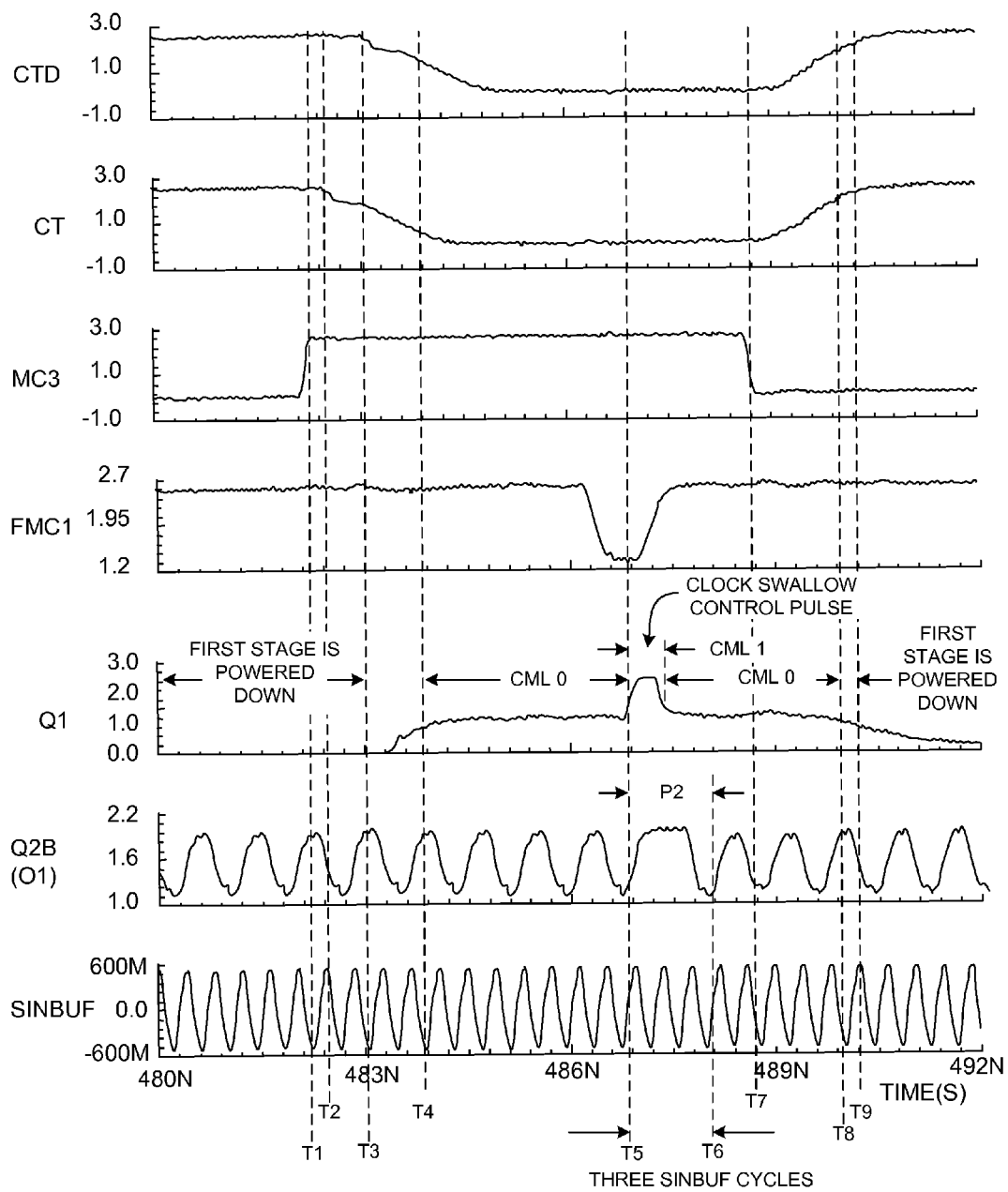
FIG. 18 is a detailed waveform diagram of an operation of the MDS of FIG. 14 in the divide-by-three mode.

FIG. 18 is a more detailed waveform diagram of an operation of MDS stage 142 of FIG. 14 when MDS stage 142 is in the divide-by-three mode (S[0]=1). The power enable override signal SPEN is not asserted. Prior to time T1, modulus control signal MC3 is a digital logic low, thereby causing signals CT and CTD to have digital logic high values and keeping the first stage powered down. The waveform labeled Q1 indicates the time that first stage 157 is powered down. At time T1, the feedback modulus control signal MC3 transitions high. The high value of MC3 passes through multiplexer 187 and inverter 189 (see FIG. 14), such that signal CT is forced to a digital logic low value starting at time T2. As indicated in the waveform labeled CT, the signal voltage ramps down relatively slowly. The high value of MC3 also passes delay element 193, NAND gate 190, inverter 191 and inverter 192, such that signal CTD is forced to a digital low value starting at time T3. The voltage of the signal Q1 is seen to increase up to a voltage that corresponds to a proper digital logic low value by time T4. First stage 157 is considered to be powered up by time T4. Then, at around time 486 nanoseconds in the waveforms of FIG. 18, the feedback modulus control signal FMC1 pulses to a digital logic low value. First stage 157 of the circuit of FIG. 14, which at this point is powered and functioning, clocks in this digital logic low value at time T5. The result is a transition of the Q1 output of the first stage 157 to a digital logic high value, thereby generating the "clock swallow control pulse". The label "CML1" in the Q1 waveform of FIG. 18 denotes this digital logic high value. The clock swallow control pulse causes second stage 158 to suspend toggling for the next SINBUF cycle and thereby to "swallow" one clock cycle of SINBUF. Note that the Q2B output of second stage 158, rather than continuing to toggle as it did prior to time T5, now maintains its digital logic high value for one additional SINBUF clock cycle. The digital logic value of signal Q1 returns to a digital logic low level. The period P2 of MDS stage 142 from time T5 to time T6 is three SINBUF clock periods. After the divide-by-three operation that terminates at time T6, the second stage 158 returns to its divide-by-two toggling operation. At time T7, the modulus control signal MC3 transitions to a digital logic low level thereby causing the CT and CTD signals to return to their digital logic high values by times T8 and T9, respectively. When the signals CT and CTD return to their digital logic high values, the first stage 157 is again powered down and transistor 184 is again conductive so that the Q1 output of the first stage is held at the proper digital logic low level. In one specific embodiment of the MMD of FIG. 4 utilizing the MDS architecture of FIG. 14, unpowering the first stage of the CML MDS stages as described above results in a twenty percent reduction in MMD power supply current consumption. This reduction in power supply current consumption is achieved without degrading frequency resolution of the MMD or compromising the low spurious noise performance of the MMD.

Figure 19:
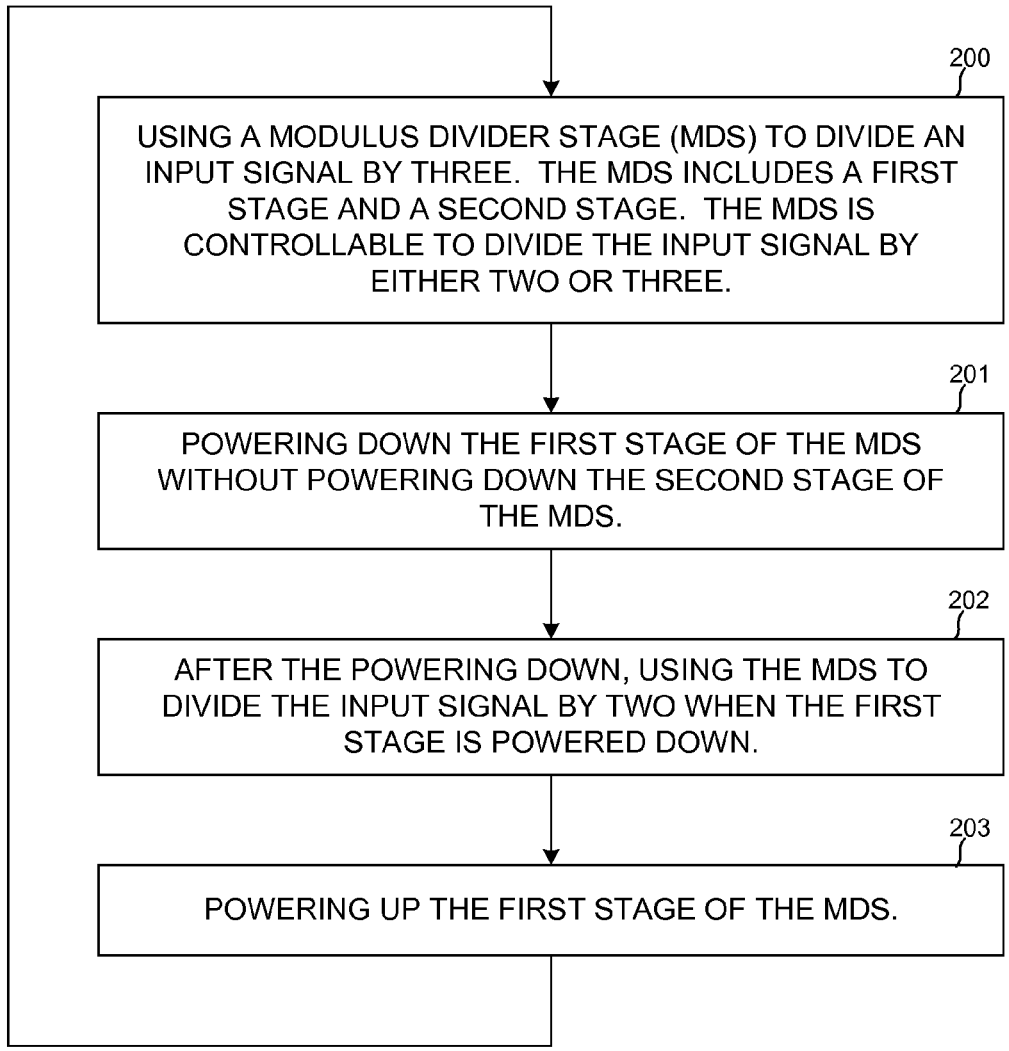
FIG. 19 is a flowchart of a method in accordance with one novel aspect.

FIG. 19 is a flowchart diagram of a method in accordance with one novel aspect. A modulus divider stage (MDS) is controllable to divide an input signal by either two or three. The MDS has a first stage and a second stage. The MDS of FIG. 14 is an example of a suitable MDS having a first stage and a second stage. Initially, the MDS is used (step 200) to divide the input signal by three. When the MDS is dividing by three, both the first stage and the second stage are powered. Next, the first stage is powered down (step 201) without powering down the second stage. In one example, the MDS may be dividing the input signal by two during the time the first stage is being powered down. After the powering down, then the MDS is used to divide the input signal by two (step 202) when the first stage is unpowered. After the MDS has divided the input signal by two when the first stage is unpowered, then the first stage of the MDS is powered up (step 203). In one example, this powering up is performed in anticipation of an upcoming divide-by-three operation to be performed by the MDS. Process flow returns to step 200 such that the MDS is used to divide the input signal by three.

Although certain specific embodiments are described above for instructional purposes, the teachings of this patent document have general applicability and are not limited to the specific embodiments described above. The power saving techniques set forth above can be applied to circuits using logic architectures other than CMOS and CML. The proportion of the MMD of FIG. 4 that is realized in CML versus CMOS can be changed. In one embodiment, a buffer is disposed between the output of MDS 144 and the input of MDS 145. The same type of buffer is disposed in the MC1 signal path leading into the SB input lead of flip-flop 154 of FIG. 6.

This type of buffer includes four N-channel field effects transistors M1-M4, two pulldown resistors R1 and R2, and a capacitor C1. The drains of M1 and M2 are connected to VDD. The source of M1 is connected to the gate of M4 and to the drain of M3. The source of M2 is connected to the gate of M3 and to the drain of M4. R1 is connected between the source of M3 and ground. R2 is connected between the source of M4 and ground. There are no pullup resistors coupled to the gates of M3 and/or M4. The signal input to the buffer, input signal IN, is supplied to the gate of M1. The inverse of this input signal, input signal INB, is supplied to the gate of M2. One terminal of capacitor C1 is coupled to the source of M3 and the terminal is coupled to the source of M4. The buffer has two output nodes. One of the output nodes is the source of M1. The other of the output nodes is the source of M2. These nodes are directly coupled (not capacitively coupled) by contiguous conductors LINE1 and LINE2 to the load being driven. In one example, LINE1 is directly connected to the gate of an N-channel transistor M5 in the load. LINE2 is directly connected to the gate of another N-channel transistor M6 in the load. In comparison to a conventional CML driver that is capacitively coupled to its load, the buffer disclosed above is directly connected (D.C. coupled) to the load. The buffer automatically biases the operating point of the load. The D.C. bias voltage on the gate of M5 is self-biased to be roughly the sum of the gate-to-source voltage of M4 and the voltage dropped across R2. Due to this biasing, the bias points of the buffer and load are the same, and the buffer need not be capacitively coupled to the load but rather is directly connected to the load. In a conventional CML driver where the driver is capacitively coupled to its load, lower frequency signals (for example, signals of frequencies less than ten megahertz) have difficulty passing through the capacitors of the capacitive coupling. Ninety percent of such signals may be rejected by circuit. Signal strength in the load is therefore small for such low frequency signals. As a consequence, the conventional circuit may not see use where such lower frequency signals are to pass through the buffer during circuit operation. In the directly coupled buffer described above, more energy in low frequency signals is transferred to the load due to the direct buffer/load connection, and the buffer sees use where signals having low frequency components (for example, down to five kilohertz) are to pass through the buffer during circuit operation. By dispensing with the capacitors of the convention buffer circuit, the size of the overall circuit is made smaller as is the length of the connections between buffer and load. Because the connections can be made shorter and smaller, the parasitic capacitances of the connections is less. Die area is saved. Because the buffer need not drive these parasitic capacitances during circuit operation, power consumption is reduced in comparison with the conventional buffer.

The output synchronizer of FIG. 6 is but one example of an output synchronizer that synchronizes without using the high speed MMD input signal. In another example, the signals MC1 and MC1B are supplied to the set and reset input leads of a CML latch. The Q output lead of the CML latch is coupled to a clock input lead of a D-type flip-flop. The D-input of the flip-flop is held at a digital logic low. The logical inverse of the O6 signal of FIG. 4 is coupled to an asynchronous set input lead (SB) of the flip-flop. The SOUT signal is output onto the Q output lead of the flip-flop. In addition to the circuit just described, other circuits can be used that generate one edge of the desired signal SOUT using MC1, and that generate the next edge of SOUT using an MDS output signal.

Accordingly, various modifications, adaptations, and combinations of the various features of the described specific embodiments can be practiced without departing from the scope of the claims that are set forth below.

What is claimed is:

1. A method comprising:
   (a) using a modulus divider stage (MDS) to divide an input signal by three, wherein the MDS includes a first stage and a second stage, wherein the MDS is controllable to divide the input signal by either two or by three;
   (b) powering down the first stage of the MDS without powering down the second stage of the MDS; and
   (c) after said powering down of step (b) using the MDS to divide the input signal by two when the first stage is powered down.

2. The method of claim 1, wherein the using of step (a) involves:
   receiving a pulse of a feedback modulus control signal into the MDS; and
   using the first stage to detect the pulse of the feedback modulus control signal and to assert a clock swallow control pulse, the clock swallow control pulse causing the second stage to suspend a toggle operation performed by the second stage.

3. The method of claim 2, wherein the first stage supplies the clock swallow control pulse across a signal conductor to the second stage, wherein the clock swallow control pulse is a pulse of a first digital logic level, and wherein when the first stage of the MDS is powered down the signal conductor is maintained at a second digital logic level.

4. The method of claim 3, wherein the signal conductor is maintained at the second digital logic level by controlling a transistor to couple the signal conductor to a ground conductor when the first stage of the MDS is powered down.

5. The method of claim 2, further comprising:
   (d) after said using of step (c) powering up the first stage of the MDS and then repeating step (a).

6. The method of claim 5, wherein the powering up of the first stage in step (d) is started more than one input signal clock period prior to the dividing of the input signal by three in the subsequent step (a).

7. The method of claim 1, wherein the MDS is operable in either a divide-by-two mode or a divide-by-three mode, wherein in the divide-by-two mode the MDS divides the input signal by two regardless of a value of a feedback modulus control signal, wherein in the divide-by-three mode the MDS divides the input signal by either two or by three depending on a value of the feedback modulus control signal, and wherein the dividing by two of step (c) is performed when the MDS is operating in the divide-by-two mode.

8. The method of claim 1, wherein the MDS is operable in either a divide-by-two mode or a divide-by-three mode, wherein in the divide-by-two mode the MDS divides the input signal by two regardless of a value of a feedback modulus control signal, wherein in the divide-by-three mode the MDS divides the input signal by either two or by three depending on a value of the feedback modulus control signal, and wherein the dividing by two of step (c) is performed when the MDS is operating in the divide-by-three mode.

9. The method of claim 1, wherein the MDS is realized at least in part in current mode logic (CML).

10. The method of claim 1, wherein the first stage comprises an amount of flip-flop circuitry and a supply voltage conductor, and wherein said powering down of step (b) involves decoupling the amount of flip-flop circuitry from the supply voltage conductor.

11. A multi-modulus divider comprising:
a first modulus divider stage (MDS) that divides an input clock signal by either two or three and outputs an output clock signal, wherein the first MDS comprises:
   a first stage that outputs a clock swallow control pulse when the first MDS is to divide by three, wherein the first stage is powered down at least part of a time that the first MDS is dividing by two; and
   a second stage that toggles when the first MDS is dividing by two, the second stage outputting the output clock signal, the second stage suspending a toggle operation upon receipt of the clock swallow control pulse such that the MDS divides by three.

12. The multi-modulus divider of claim 11, further comprising:
a second modulus divider stage (MDS) that receives the output clock signal from the first MDS and that outputs a feedback modulus control signal,
wherein the first stage of the first MDS receives the feedback modulus control signal from the second MDS, the first stage of the first MDS outputting the clock swallow control pulse in response to receiving the feedback modulus control signal.

13. The multi-modulus divider of claim 11, wherein the first MDS is operable in either a divide-by-two mode or a divide-by-three mode, wherein in the divide-by-two mode the first MDS divides the input signal by two regardless of a value of the feedback modulus control signal received from the second MDS, wherein in the divide-by-three mode the MDS divides the input signal by either two or by three depending on a value of the feedback modulus control signal received from the second MDS, and wherein said at least part of the time during which the first stage is powered down is a time that the first MDS is operating in the divide-by-two mode.

14. The multi-modulus divider of claim 11, wherein the first MDS is operable in either a divide-by-two mode or a divide-by-three mode, wherein in the divide-by-two mode the first MDS divides the input signal by two regardless of a value of the feedback modulus control signal received from the second MDS, wherein in the divide-by-three mode the MDS divides the input signal by either two or by three depending on a value of the feedback modulus control signal received from the second MDS, and wherein said at least part of the time during which the first stage is powered down is a time that the first MDS is operating in the divide-by-three mode.

15. The multi-modulus divider of claim 11, wherein the first stage of the first MDS comprises:
a signal conductor across which the first stage of the first MDS supplies the clock swallow control pulse to the second stage of the first MDS; and
a transistor that couples the signal conductor to a ground conductor when the first stage of the MDS is powered down.

16. The multi-modulus divider of claim 11, wherein the first stage of the first MDS comprises:
an amount of flip-flop circuitry;
a supply voltage conductor; and
circuitry that decouples the amount of flip-flop circuitry from the supply voltage conductor when the first stage of the first MDS is powered down and that couples the amount of flip-flop circuitry to the supply voltage conductor when the first stage of the first MDS is powered.

17. A circuit comprising:
a first flip-flop having clock input node, a data input node and a data output node;
a first NOR circuit that outputs a signal onto the data input node of the first flip-flop, the first NOR circuit having a first input lead, a second input lead, and a third input lead, wherein a modulus divisor control signal is present on the first input lead of the first NOR circuit, wherein a feedback modulus control signal is present on the second input lead of the first NOR circuit;
a second flip-flop having a clock input node, data input node and a data output node, the clock input node of the second flip-flop being coupled to the clock input node of the first flip-flop; and
a second NOR circuit that outputs a signal onto the data input node of the second flip-flop, the second NOR circuit having a first input lead and a second input lead, wherein the first input lead of the second NOR circuit is coupled to the data output node of the first flip-flop, and wherein the second data input lead of the second NOR circuit is coupled to receive a data output signal output from the second flip-flop,
wherein the first flip-flop is powered down during a time that the second flip-flop is functioning as a toggle flip-flop and is dividing an input signal on the clock input node of the second flip-flop by two, and wherein the first flip-flop is powered up during a time that the first flip-flop, the first NOR circuit, the second flip-flop and the second NOR circuit are operating together to divide the input signal by three.

18. The circuit of claim 17, wherein the second flip-flop has a second data output node, wherein the data output signal that is output from the second flip-flop onto the second data input lead of the second NOR circuit is a signal on the second data output node of the second flip-flop.

19. The circuit of claim 17, wherein the circuit is a modulus divider stage (MDS) of a multi-modulus divider, the multi-modulus divider including a plurality of other modulus divider stages, wherein one of the other modulus divider stages supplies the feedback modulus control signal onto the second input lead of the first NOR circuit.

20. The circuit of claim 17, wherein the circuit is a modulus divider stage (MDS) of a multi-modulus divider, the multi-modulus divider dividing an input clock signal by a divisor value and outputting an output clock signal, wherein the divisor value is determined by a plurality of modulus divisor control signals, and wherein the modulus divisor control signal that is present on the first input lead of the first NOR circuit is one of the plurality of modulus divisor control signals.

21. A modulus divider stage comprising:
a flip-flop stage that has a control input lead, a clock input lead, and a data output lead, wherein the flip-flop stage receives a clock input signal onto its clock input lead and toggles if a first digital logic level is present on the control input lead, wherein the toggling is suspended if a second digital logic level is present on the control input lead at a particular time; and
means for detecting a feedback modulus control signal and for asserting a clock swallow control pulse onto the control input lead at the particular time such that the toggling of the flip-flop is suspended for one period of the clock input signal, the clock swallow control pulse being a pulse of the second digital logic level, wherein the means is substantially unpowered prior to the detecting of the feedback modulus control signal, is powered during the detecting of the feedback modulus control signal and during the asserting of the clock swallow control pulse, and is then substantially unpowered after the clock swallow control pulse.

22. The modulus divider stage of claim 21, wherein the particular time is a time when a transition of the clock input signal occurs, wherein the flip-flop stage includes a flip-flop, and wherein the toggling is suspended by preventing the flip-flop from changing states in response to the clock input signal transition.

23. A multi-modulus divider comprising:
   means to divide an input signal by three using a modulus divider stage (MDS), wherein the MDS includes a first stage and a second stage, wherein the MDS is controllable to divide the input signal by either two or by three;
   means for powering down the first stage of the MDS without powering down the second stage of the MDS; and
   means for dividing the input signal by two when the first stage is powered down.

24. The multi-modulus divider of claim 23, further comprising:
   means for receiving a pulse of a feedback modulus control signal into the MDS;
   means for detecting the pulse of the feedback modulus control signal using the first stage; and
   means for asserting a clock swallow control pulse, the clock swallow control pulse causing the second stage to suspend a toggle operation performed by the second stage.

25. The multi-modulus divider of claim 24, wherein the first stage supplies the clock swallow control pulse across a signal conductor to the second stage, wherein the clock swallow control pulse is a pulse of a first digital logic level, and wherein when the first stage of the MDS is powered down the signal conductor is maintained at a second digital logic level.

26. The multi-modulus divider of claim 25, wherein the signal conductor is maintained at the second digital logic level by controlling a transistor to couple the signal conductor to a ground conductor when the first stage of the MDS is powered down.

27. The multi-modulus divider of claim 24, further comprising:
   means for powering up the first stage of the MDS.

* * * * *